(12) United States Patent
Goericke et al.

(10) Patent No.: US 12,272,912 B2
(45) Date of Patent: Apr. 8, 2025

(54) ELECTRICAL CONTACTS USING AN ARRAY OF MICROMACHINED FLEXURES

(71) Applicant: Atomic Machines, Inc., Berkeley, CA (US)

(72) Inventors: Fabian Goericke, Berkeley, CA (US); Klaus Zietlow, Berkeley, CA (US); James Stölken, Berkeley, CA (US)

(73) Assignee: Atomic Machines, Inc., Berkeley, CA (US)

( * ) Notice: Subject to any disclaimer, the term of this patent is extended or adjusted under 35 U.S.C. 154(b) by 0 days.

(21) Appl. No.: 18/667,483

(22) Filed: May 17, 2024

(65) Prior Publication Data

US 2024/0405454 A1  Dec. 5, 2024

Related U.S. Application Data

(60) Provisional application No. 63/504,869, filed on May 30, 2023.

(51) Int. Cl.
*H01R 4/26* (2006.01)
*B81B 7/02* (2006.01)
*B81C 1/00* (2006.01)

(52) U.S. Cl.
CPC ........... *H01R 4/26* (2013.01); *B81B 7/02* (2013.01); *B81C 1/00206* (2013.01);
(Continued)

(58) Field of Classification Search
CPC .......... H01R 4/26; H01R 39/18; H01R 39/24; H01R 39/26–28; H01R 39/36; H01R 39/38; H01R 39/381; H01R 39/383; H01R 39/385; H01R 39/388; H01R 39/39; H01R 39/40; H01R 39/42; H01R 39/44; H01R 39/50; H01R 39/54; H01R 39/58; H01R 39/59; H01R 39/62; B81B 7/02; B81C 1/00206; B81C 2201/01; B81C 2203/0361; B81C 2207/056; B81C 2201/0107; B81C 2201/0143; B81C 2201/0145; B81C 2201/0174
See application file for complete search history.

(56) References Cited

U.S. PATENT DOCUMENTS 2,269,614 A * 1/1942 Von Soden ............ H01R 39/22
  310/228
4,277,708 A * 7/1981 McNab .................. H01R 39/46
  310/248

(Continued)

*Primary Examiner* — Harshad C Patel
(74) *Attorney, Agent, or Firm* — Polsinelli PC; Kory D. Christensen; David Hsu

(57) ABSTRACT

A contact having a first contact member having an exposed surface, the exposed surface having irregularities, undulations, or asperities that form one or more high points and low points on the exposed surface, a second contact member having a contact base surface, a plurality of electrically conductive flexures extending from the contact base surface, and when the first contact member is positioned adjacent to the second contact member in a closed position in which the contact base surface of the second contact member is not in electrical contact with the one or more high points on the exposed surface of the first contact member, each flexure of the plurality of flexures is in electrical contact with the exposed surface of the first contact member.

26 Claims, 4 Drawing Sheets

D – Flexible contact – closed

(52) U.S. Cl.
 CPC ... *B81B 2201/01* (2013.01); *B81B 2203/0361* (2013.01); *B81B 2207/056* (2013.01); *B81C 2201/0107* (2013.01); *B81C 2201/0143* (2013.01); *B81C 2201/0145* (2013.01); *B81C 2201/0174* (2013.01)

(56) References Cited

U.S. PATENT DOCUMENTS

| | | | | |
|---|---|---|---|---|
| 4,337,407 | A * | 6/1982 | Hummert | H01R 39/24 310/252 |
| 4,358,699 | A * | 11/1982 | Wilsdorf | H01R 39/24 428/611 |
| 4,483,574 | A * | 11/1984 | Chabrerie | H01R 39/24 439/5 |
| 5,633,700 | A * | 5/1997 | Peck | G01R 29/12 399/73 |
| 7,138,743 | B1 * | 11/2006 | Sondergaard | H01R 39/30 310/248 |
| 7,339,302 | B2 * | 3/2008 | Lewis | H01R 39/381 310/238 |
| 7,557,485 | B1 * | 7/2009 | Lynch | H01R 39/18 310/248 |
| 7,622,844 | B1 * | 11/2009 | Kuhlmann-Wilsdorf | H01R 39/24 310/248 |
| 8,167,623 | B2 * | 5/2012 | Schlichtherle | H01R 39/64 310/248 |
| 8,398,413 | B2 * | 3/2013 | Tucci | H01C 10/30 200/275 |
| 8,513,853 | B2 * | 8/2013 | Luthardt | H01R 39/24 310/248 |
| 9,281,648 | B2 * | 3/2016 | Pollner | H01R 39/643 |
| 9,490,600 | B2 * | 11/2016 | Holzapfel | H01R 39/64 |
| 10,364,617 | B2 * | 7/2019 | Kirkhope | H01R 43/10 |
| 10,424,889 | B2 * | 9/2019 | Geyer | H01R 39/025 |
| 11,261,081 | B2 * | 3/2022 | Ng | G02B 27/646 |
| 2004/0175968 | A1 | 9/2004 | Sasaki et al. | |
| 2013/0329106 | A1 * | 12/2013 | Bigioi | G03B 3/10 348/308 |
| 2014/0292137 | A1 * | 10/2014 | Le Moal | H02N 1/008 29/25.01 |
| 2020/0136527 | A1 | 4/2020 | Ng et al. | |
| 2022/0209477 | A1 | 6/2022 | Williford et al. | |

* cited by examiner

A – Solid contact – open

B – Solid contact – closed

C – Flexible contact – open

D – Flexible contact – closed

ELECTRICAL CONTACTS USING AN ARRAY OF MICROMACHINED FLEXURES

BACKGROUND

Technical Field

The present disclosure pertains to electrical switches and, more particularly, to micro-electromechanical (MEMS) switches utilizing dry flexible contact.

DESCRIPTION OF THE RELATED ART

Conventional solid electrical contacts rely on normal forces pressing two conductors together to yield low contact resistance. The force is needed to flatten asperities on the surfaces to increase the actual contact area. Smaller forces result in higher contact resistance, which limits the current handling capability of the contacts.

BRIEF SUMMARY

The present disclosure is directed to a contact having micro-electromechanical (MEMS) switches utilizing dry flexible contact. In accordance with one aspect of the present disclosure, a contact is provided that includes a first contact member having an exposed surface, the exposed surface having asperities that form one or more high points and low points on the exposed surface; and a second contact member having a contact base surface, and a plurality of electrically conductive flexures extending from the contact base surface; wherein the first contact member and the second contact member may be moved relative to each other to provide differentiated open and closed positions; and further wherein, when the first contact member is positioned adjacent the second contact member in a closed position in which the contact base surface of the second contact member is not in electrical contact with the one or more high points on the exposed surface of the first contact member, each flexure of the plurality of electrically conductive flexures is in electrical contact with the exposed surface of the first contact member.

In accordance with another aspect of the present disclosure, all of the plurality of electrically conductive flexures extending from the second contact member have an identical height above the contact base surface of the second contact member, the height being greater than a sum of a first distance between the high points and the low points on an exposed surface of the first contact member and a separation distance between the exposed surface of the first contact member and the high point of the contact base surface of the second contact member when the first contact member is in the closed position.

In accordance with a further aspect of the present disclosure, the plurality of electrically conductive flexures are formed at less than a right angle to the contact base surface of the second contact member.

In accordance with another aspect of the present disclosure, each of the plurality of electrically conductive flexures has a planform profile dimension in the range of 3 microns by 3 microns to and including 100 microns by 100 microns, with gaps in the range of 10 microns to and including 200 microns between each row of fingers. If the fingers are formed by growing carbon nanotubes then the preferred dimensions would be in the range of 0.4 nanometers to 100 nanometers in diameter and the spacing would be in the range of 1 to 10 nanometers between fingers. In one implementation the dimensions are 20 microns by 20 microns and further including gaps between adjacent flexures of 100 microns.

In accordance with still yet another aspect of the present disclosure, wherein each flexure of the plurality of electrically conductive flexures has a planform profile with dimensions between 10 and 50 microns in one direction and between 10 and 50 microns in a dimension perpendicular to the one direction, and further including gaps between adjacent flexures of 20 to 200 microns.

In accordance with yet a further aspect of the present disclosure, either the exposed surface of the first contact member or the contact surface of the second contact member is further modified with a hard stop that prevents the first contact member and the second contact member from getting so close together as to cause the conductive flexures to be bent to a point of damage when the first contact member is in the closed position.

In accordance with another aspect of the present disclosure, at least the exposed surface of the first contact member is formed of a material that is a first metal, and an exposed surface of the first metal is coated with a different material than the first metal to reduce oxidation of the first metal.

In accordance with a further aspect of the present disclosure, at least the exposed surface of the first contact member is formed of a material that is a first metal, and an exposed surface of the first metal is coated with a different material than the first metal to reduce wear on either one or both of the exposed surface and the contact surface of the first contact member and the second contact member. Either one or both the first and second contact members may have this coating.

In accordance with another aspect of the present disclosure, wherein the plurality of electrically conductive flexures are formed from a laser micromachining process or from an electrical discharge machining (EDM) process. Alternatively the plurality of electrically conductive flexures are formed from an additive manufacturing process, or the plurality of electrically conductive flexures may be formed of carbon nanotubes grown upon a base surface, or by any other suitable means of forming such flexures.

In accordance with the present disclosure, a circuit is provided that includes a contact that has a first contact member having an exposed surface, the exposed surface having asperities that form one or more high points and low points on the exposed surface; and a second contact member having a contact base surface, and a plurality of electrically conductive flexures extending from the contact base surface; wherein the first contact member and the second contact member may be moved relative to each other to provide differentiated open and closed positions; and further wherein, when the first contact member is positioned adjacent the second contact member in a closed position in which the contact base surface of the second contact member is not in electrical contact with the one or more high points on the exposed surface of the first contact member, each flexure of the plurality of electrically conductive flexures is in electrical contact with the exposed surface of the first contact member.

BRIEF DESCRIPTION OF THE SEVERAL VIEWS OF THE DRAWINGS

The foregoing and other features and advantages of the present disclosure will be more readily appreciated as the same become better understood from the following detailed description when taken in conjunction with the accompanying drawings, wherein.

DETAILED DESCRIPTION

Figure 1A:
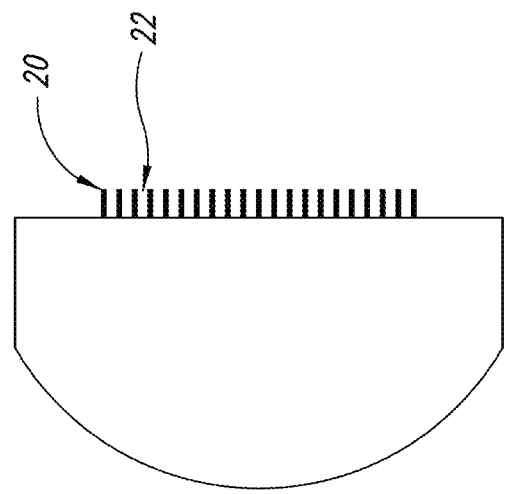
FIGS. 1A and 1B are illustrations of a contact array formed in accordance with the present disclosure.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with breakers, relays, coils, and typical electrical components have not been shown or described in detail to avoid unnecessarily obscuring descriptions of the implementations.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one implementation" or "an implementation" means that a particular feature, structure, or characteristic described in connection with the implementation is included in at least one implementation. Thus, the appearance of the phrases "in one implementation" or "in an implementation" in various places throughout this specification are not necessarily all referring to the same implementation. Furthermore, the particular features, structures, or characteristics may be combined in any suitable manner in one or more implementations. It will be appreciated that for simplicity and clarity of illustration, where considered appropriate, reference numerals may be repeated among the figures to indicate corresponding or analogous elements or steps.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

The headings and Abstract of the Disclosure provided herein are for convenience only and do not interpret the scope or meaning of the implementations.

The present disclosure is directed to a contact, an associated circuit, and system wherein the contact is minimizing the required force on a switch contact to achieve a desired (low) contact resistance. Inelastic deformation that causes two surfaces to conform will by definition require higher forces than elastic deformation because the inelastic deformation yield point is always beyond the elastic deformation limit.

Using a multitude of elastic spring flexures ("fingers") to form a compound contact allows the individual contacts to conform to the mating side without lifting the surrounding fingers off the surface, thus allowing all or at least most fingers to make contact.

The available contact force is divided up over the sum of the fingers based on the amount of travel each finger needs to accommodate. A desirable improvement to the scheme is to make the individual spring elements constant-force or at least non-linear to better equalize the forces experienced by each spring element.

Multi-finger contacts may be fabricated using micromachining techniques including wire Electric Discharge Machining (EDM) and laser micromachining using femtosecond lasers. Contacts may be fabricated from metallic materials including copper, beryllium copper, and other conductors.

Figure 1B:
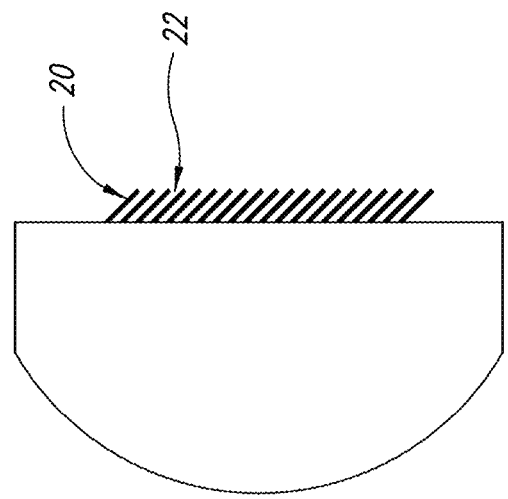
Figure 4:
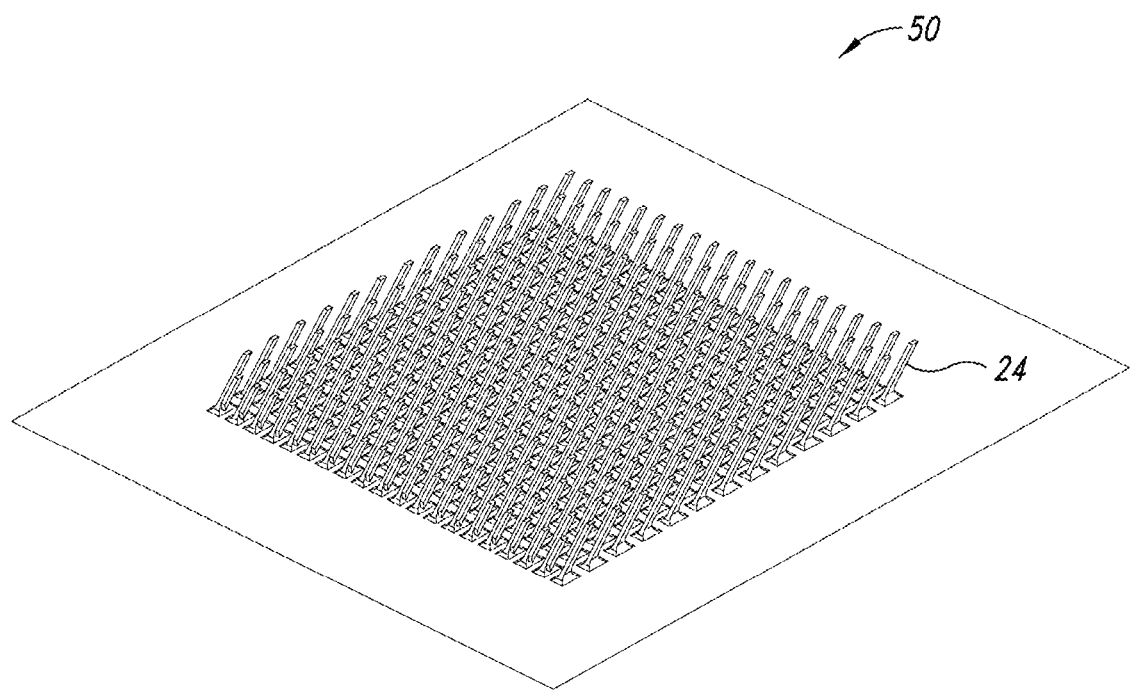
FIG. 4 illustrates an array of flexures formed in accordance with the present disclosure.

The plurality of electrically conductive flexures may be formed from a laser micromachining process. Alternatively the plurality of electrically conductive flexures may be formed from an additive manufacturing process, or the plurality of electrically conductive flexures may be formed of carbon nanotubes grown upon a base surface Flexible cantilever finger structures are cut at an angle to the contact base surface. The fingers may be cut in a rectangular array or in a linear array or in other patterns such as hexagonal or circular arrangements of flexures. FIGS. 1A and 1B are illustrations of an array of 13×20=260 fingers, with only 21 fingers 20 shown. FIG. 1A shows a set of vertical cuts (gaps 22) made by a machining tool. FIG. 1B shows angled fingers 20 formed with an orthogonal set of cuts (gaps 22) made at a 45-degree angle. The result would be an array 50 as shown in FIG. 4, which could be composed of 260 fingers 24. Each finger 20, 24, if micromachined, has a preferred dimension in the range of 3 microns by 3 microns to and including 100 microns by 100 microns, with gaps 22, 26 in the range of 10 microns to and including 200 microns between each row of fingers 20, 24. If the fingers 20,24 are formed by growing carbon nanotubes then the preferred dimensions would be in the range of 0.4 nanometers to 100 nanometers in diameter and the spacing would be in the range of 1 to 10 nanometers between fingers.

As electromechanical relays reduce in size, the force available to press the contacts together becomes smaller due to reduced volume for magnetic material and for current-carrying conductors in the electromagnetic actuator. The available force is divided amongst all the contacts in the array. It can be shown that the electrical resistance of an array of N flexures with a given total normal force and given total contact area is proportional to 1/(square root N). Thus, a contact with a 10-by-10 array of fingers will have 100 contacts and $\frac{1}{10}$th the resistance of a single contact compressed with the same total force. See "Contact Flexure Array Scaling Mathematical Analysis" further below for a mathematical derivation of this result.

Figure 2A:
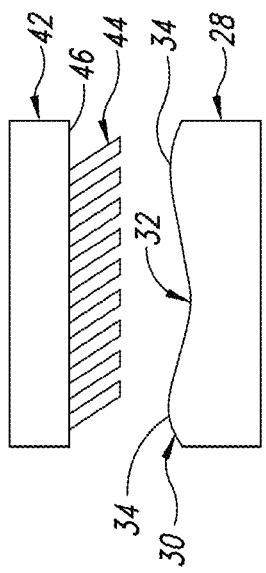
FIGS. 2A and 2B are illustrations of the operation of a conventional contact.
Figure 2B:
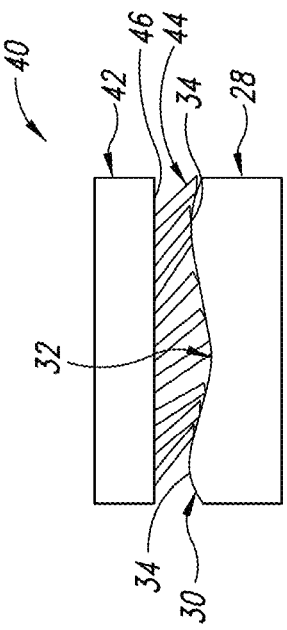
Figure 3A:
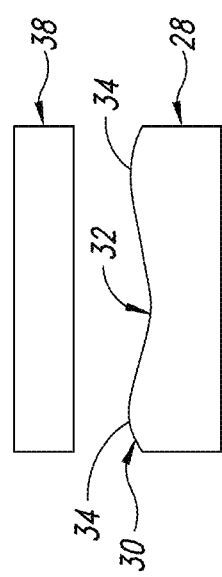
FIGS. 3A and 3B illustrate the construction and operation, respectively, of a contact using the contact array of FIG. 1B in accordance with the present disclosure.
Figure 3B:
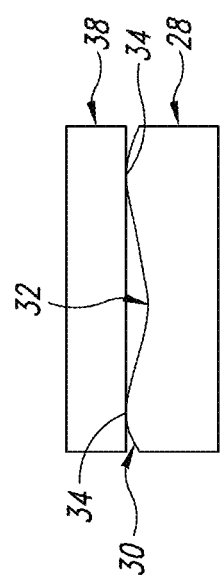

FIGS. 2A-2B illustrate a conventional contact structure and FIGS. 3A-3B illustrate how a contact structure of the present disclosure works. Each of the four views in FIGS. 2A-2B and FIGS. 3A-3B shows an identical rigid lower contact member 28 that has an undulating upper surface 30, which forms a valley 32 between two asperities 34 or high points. For the purpose of illustration the undulations in the surface are exaggerated in the figures. Note that the undulations in the figure do not represent intentional features of the contact, but rather inadvertent artifacts left behind by the fabrication or wear of the contact material. In FIGS. 2A-2B, a traditional solid contact 38 is shown in open and closed states, respectively.

In operation, the solid moveable upper contact member 38, shown in FIG. 2A positioned above the lower contact member 28, makes contact with the lower contact member 28 as shown in FIG. 2B, but only on the two asperities 34 or high points on the lower contact member 28. This limits the surface area available for electrical contact and resulting conduction. In a traditional relay or switch, the solution to this problem is to apply more force to the upper contact member 38. With adequate force, the upper contact member 38 or lower contact member 28 will plastically deform, which will provide a larger surface contact with the lower contact member 28 and therefore lower resistance.

Referring next to FIGS. 3A-3B, shown therein is a novel flexible contact array device 40 formed in accordance with the present disclosure. The lower contact member 28 previously described is shown positioned below an upper contact member 42 formed in accordance with the present disclosure. In FIG. 3A the upper contact member 42 is in an open position and in FIG. 3B the upper contact member 42 is in a closed position. The upper contact member 42 has multiple flexures, also referred to herein as fingers, 44 extending from a lower surface 46. As shown in FIG. 3A, the fingers 44 are in a relaxed, straight position and not in contact with the lower contact member 28.

As the contact 40 is closed by moving the upper contact member 42 towards the lower contact member 28 to be in a closed position, the fingers 44 bend as they move into contact with the upper surface 30 of the lower contact member 28. With the fingers 44 in contact with the highest asperity 34 on the lower contact member 28, and bending the most compared to the fingers 44 in contact with the lowest point in the valley 32, the total force required to bend the fingers 44 is much lower than the total force required to plastically deform the upper contact member 38 in the typical contact design. The number of contact points when the contact 40 is in the closed position shown in FIG. 3B is now equal to the number of fingers 44 in contact with lower contact member 28. In this closed position the lower surface 46 of the upper contact member 42 is positioned a first distance from the lowest point 32 of the upper surface 30 of the lower contact member 28. This first distance includes a separation distance between the highest asperity 34 and the lower surface 46 of the upper contact member 42, which is shorter than the first distance.

Ideally, all of the plurality of electrically conductive fingers 44 extending from the upper contact member 42 have an identical height or distance from the contact base surface (lower surface 46) of the upper contact member 42. This distance is greater than a sum of a first distance between the high points 34 and the low points 32 on the exposed upper surface 30 of the lower contact member 28 and a separation distance between the lower surface 46 of the upper contact member 42 and the highest of one or more high points 34 of the upper surface 30 on the lower contact member 28 when the upper contact member 42 is in the closed position.

The reduced contact force requirement of this flexure array design is a key enabler for the use of small, relatively weak electromagnetic actuators to achieve low resistance contacts.

Micro-machining (laser) or EDM (Electric Discharge Machining) can be used to create an array of tilted cantilever spring flexures from a solid conductor. This allows the use of an arbitrarily thick base material with the best possible conduction path since no additional bonding is required. The spring geometry and material can be optimized to give the lowest contact resistance for a given set of normal forces and range of compliance (surface unevenness). The springs or fingers 44 can be coated after they are machined to improve resistance to oxidation, or to provide other beneficial characteristics such as reducing friction at the contact surface or providing a soft material at the tip to increase the degree of plastic deformation where the flexure makes contact with the opposing contact. Spring flexures may be formed with a variety of shapes beyond simple tilted cantilevers, including S-shaped springs, helical springs, buckling springs, or any shape of structure which will deform elastically under a force normal to the main contact surface. Such flexures may be formed using a variety of processes including 3D printing using metals or plated polymers, photochemical etching, reactive ion etching, or deposition or growth of carbon nanotube structures.

As will be readily appreciated from the foregoing, the present disclosure provides a contact structure that provides for the creation of lower-resistance contact members when only low normal forces are available. This is of particular interest in circuits and systems that utilize miniature relays or for general relays that need to be optimized for low power in the coil drive.

Figure 5:
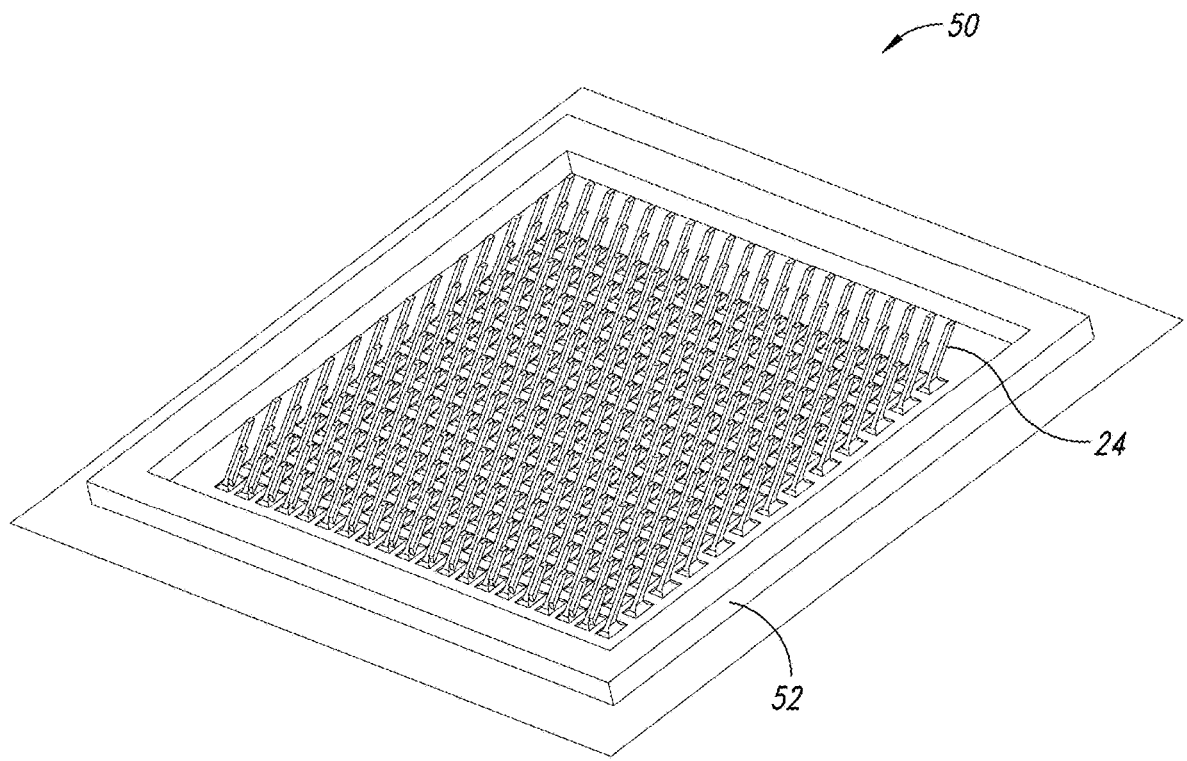
FIG. 5 illustrates the array of flexures of FIG. 4 to include a circumscribing hard stop feature in accordance with the present disclosure.

The fingers may be damaged if they are bent too far by excess pressure. The geometry of the contact may be modified to provide a hard stop, which will control the maximum degree of bending of the fingers. This hard stop may be formed on either of the two contacts members, or to some degree on both contact members. The hard stop may take the form of a wall 52 surrounding the array 50 of fingers 24, but lower in overall height than the fingers 24, as shown in FIG. 5. The hard stop may also be formed as a non-continuous set of rigid structures. The height of the hard stop may be optimized to permit an ideal degree of deformation of the flexures.

Contact Flexure Array Scaling Mathematical Analysis

Upper-Bound CFA Resistance vs. Number Scaling Analysis

Assumptions:

1. Equal load-sharing of total contact array force ("F") over all ("n") contact flexures resulting in a force of F/n per individual contact.
2. Array of "n" contact flexures distributed over a fixed area (foot-print) "A."
3. Effective conductor area is a fixed fraction ($f_a$) of the foot-print area (A/n).
4. Actual electrical contact area for each flexure is controlled by Hertzian elastic contact mechanics or the plastic deformation area vs. force approximation [2].
5. Each contact is arranged in parallel with one another.

CFA Resistance Calculation

Individual Contact Spreading Resistance [1]:

$$R_s = \frac{\rho}{2 \cdot b}\left[1 - c_1 \cdot \left(\frac{b}{a}\right)^1 + c_2 \cdot \left(\frac{b}{a}\right)^2 + c_3 \cdot \left(\frac{b}{a}\right)^3 + c_4 \cdot \left(\frac{b}{a}\right)^4\right]$$

$$a = \left(\frac{f_a \cdot A}{\pi \cdot n}\right), b = \left(\frac{F}{H_p \cdot n}\right)^p$$

where $R_s$, electrical resistance of flexure contact area
$\rho$, flexure resistivity
a, effective flexure cross-sectional radius
b, effective contact radius
$c_i$, equation fitting constants
$f_a$, flexure cross-sectional shape factor relating area to effective radius
A, total area (foot-print) of flexure array
n, number of flexures P, asperity contact force-area exponent (=⅓ elastic asperities, =½ plastic asperities)
F, total force on flexure array
$H_p$, elastic or plastic asperity parameter For the most important case of plastically deformed asperities, the total contact resistance of the array (excluding the bulk resistance of the individual flexures) scales as $1/\sqrt{n}$, the inverse of the square-root of the number of flexures; more contacts means lower resistance for any given total array force and total array foot-print area.

It is to be understood that various changes can be made to the disclosure to enhance its utility. The various embodiments described above can be combined to provide further embodiments. Aspects of the embodiments can be modified, if necessary to employ concepts of the various patents, applications, and publications to provide yet further embodiments. Accordingly, the claims are not limited by the disclosure.

The invention claimed is:

1. A contact, comprising:
   a first contact member having an exposed surface, the exposed surface having asperities that form one or more high points and low points on the exposed surface; and
   a second contact member having a contact base surface, and a plurality of electrically conductive flexures extending from the contact base surface;
   wherein the first contact member and the second contact member may be moved relative to each other to provide differentiated open and closed positions;
   wherein, when the first contact member is positioned adjacent the second contact member in a closed position in which the contact base surface of the second contact member is not in electrical contact with the one or more high points on the exposed surface of the first contact member, each flexure of the plurality of electrically conductive flexures is in electrical contact with the exposed surface of the first contact member.

2. The contact of claim 1 wherein all of the plurality of electrically conductive flexures extending from the second contact member have an identical height above the contact surface of the first contact member, the height being greater than a sum of a first distance between the high points and the low points on an exposed surface of the first contact member and a separation distance between the exposed surface of the first contact member and the one or more high points of the contact base surface of the second contact member when the first contact member is in the closed position.

3. The contact of claim 1 wherein the plurality of electrically conductive flexures are formed at less than a right angle to the contact base surface of the second contact member.

4. The contact of claim 1 wherein each of the plurality of electrically conductive flexures has a planform profile dimension in a range of 3 microns by 3 microns to and including 100 by 100 microns, and further including gaps between adjacent flexures in a range of 10 microns to and including 200 microns.

5. The contact of claim 1 wherein each of the plurality of electrically conductive flexures formed from carbon nanotubes has a planform profile dimension in a range of 0.4 nanometers by 0.4 nanometers to and including 100 by 100 nanometers, and further including gaps between adjacent flexures in a range of 1 nanometer to and including 10 nanometers.

6. The contact of claim 1 wherein each flexure of the plurality of electrically conductive flexures has a planform profile with dimensions between 10 and 50 microns in one direction and between 10 and 50 microns in a dimension perpendicular to the one direction, and further including gaps between adjacent flexures of 20 to 200 microns.

7. The contact of claim 1 wherein either the exposed surface of the first contact member or the contact base surface of the second contact member is further modified with a hard stop that prevents the first contact member and the second contact member from being bent to a point of damage when the first contact member is in the closed position.

8. The contact of claim 1 wherein at least the exposed surface of the first contact member is formed of a material that is a first metal, and an exposed surface of the first metal is coated with a different material than the first metal to reduce oxidation of the first metal.

9. The contact of claim 1 at least the exposed surface of the first contact member is formed of a material that is a first metal, and an exposed surface of the first metal is coated with a different material than the first metal to reduce wear on either one or both of the exposed surface and the contact surface of the first contact member and the second contact member.

10. The contact of claim 1 wherein the plurality of electrically conductive flexures are formed from a wire electrical discharge machining process.

11. The contact of claim 1 wherein the plurality of electrically conductive flexures are formed from a laser micromachining process.

12. The contact of claim 1 wherein the plurality of electrically conductive flexures are formed from an additive manufacturing process.

13. The contact of claim 1 wherein the plurality of electrically conductive flexures are formed of carbon nanotubes grown upon a base surface.

14. A circuit, comprising:
    a contact, the contact comprising:
       a first contact member having an exposed surface, the exposed surface having asperities that form one or more high points and low points on the exposed surface; and
       a second contact member having a contact base surface, and a plurality of electrically conductive flexures extending from the contact base surface;
       wherein the first contact member and the second contact member may be moved relative to each other to provide differentiated open and closed positions;
       wherein, when the first contact member is positioned adjacent the second contact member in a closed position in which the contact base surface of the second contact member is not in electrical contact with the one or more high points on the exposed surface of the first contact member, each flexure of the plurality of electrically conductive flexures is in electrical contact with the exposed surface of the first contact member.

15. The circuit of claim 14 wherein all of the plurality of electrically conductive flexures extending from the second contact member have an identical height above the contact surface of the first contact member, the height being greater than a sum of a first distance between the high points and the low points on an exposed surface of the first contact member and a separation distance between the exposed surface of the first contact member and the one or more high points of the contact base surface of the second contact member when the first contact member is in the closed position.

16. The circuit of claim 14 wherein the plurality of electrically conductive flexures are formed at less than a right angle to the contact base surface of the second contact member.

17. The circuit of claim 14 wherein each of the plurality of electrically conductive flexures has a planform profile dimension in a range of 3 microns by 3 microns to and including 100 by 100 microns, and further including gaps between adjacent flexures in a range of 10 microns to and including 200 microns.

18. The circuit of claim 14 wherein each of the plurality of electrically conductive flexures formed from carbon nanotubes has a planform profile dimension in a range of 0.4 nanometers by 0.4 nanometers to and including 100 by 100 nanometers, and further including gaps between adjacent flexures in a range of 1 nanometer to and including 10 nanometers.

19. The circuit of claim 14 wherein each flexure of the plurality of electrically conductive flexures has a planform profile with dimensions between 10 and 50 microns in one direction and between 10 and 50 microns in a dimension perpendicular to the one direction, and further including gaps between adjacent flexures of 20 to 200 microns.

20. The circuit of claim 14 wherein either the exposed surface of the first contact member or the contact base surface of the second contact member is further modified with a hard stop that prevents the first contact member and the second contact member from being bent to a point of damage when the first contact member is in the closed position.

21. The circuit of claim 14 wherein at least the exposed surface of the first contact member is formed of a material that is a first metal, and an exposed surface of the first metal is coated with a different material than the first metal to reduce oxidation of the first metal.

22. The circuit of claim 14 at least the exposed surface of the first contact member is formed of a material that is a first metal, and an exposed surface of the first metal is coated with a different material than the first metal to reduce wear on either one or both of the exposed surface and the contact surface of the first contact member and the second contact member.

23. The circuit of claim 14 wherein the plurality of electrically conductive flexures are formed from a wire electrical discharge machining process.

24. The circuit of claim 14 wherein the plurality of electrically conductive flexures are formed from a laser micromachining process.

25. The circuit of claim 14 wherein the plurality of electrically conductive flexures are formed from an additive manufacturing process.

26. The circuit of claim 14 wherein the plurality of electrically conductive flexures are formed of carbon nanotubes grown upon a base surface.

\* \* \* \* \*